(12) United States Patent
Nguyen et al.

(10) Patent No.: US 7,389,194 B2
(45) Date of Patent: Jun. 17, 2008

(54) DRIVER CALIBRATION METHODS AND CIRCUITS

(75) Inventors: Huy M. Nguyen, San Jose, CA (US);
Vijay Gadde, Cupertino, CA (US);
Sivakumar Doraiswamy, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 148 days.

(21) Appl. No.: 11/176,876

(22) Filed: Jul. 6, 2005

(65) Prior Publication Data

US 2007/0010961 A1    Jan. 11, 2007

(51) Int. Cl.
*H03F 3/04* (2006.01)
*G01R 35/00* (2006.01)

(52) U.S. Cl. .................. 702/107; 702/65; 702/57; 330/250

(58) Field of Classification Search .............. 702/107
See application file for complete search history.

(56) References Cited

U.S. PATENT DOCUMENTS

| | | |
|---|---|---|
| 4,513,427 A | 4/1985 | Borriello et al. |
| 5,254,883 A | 10/1993 | Horowitz et al. |
| 5,298,800 A | 3/1994 | Dunlop et al. |
| 5,396,028 A | 3/1995 | Tomassetti |
| 5,606,275 A | 2/1997 | Farhang et al. |
| 5,680,060 A | 10/1997 | Banniza et al. |
| 5,726,582 A | 3/1998 | Hedberg |
| 5,926,031 A | 7/1999 | Wallace et al. |
| 5,969,658 A | 10/1999 | Naylor |
| 6,028,484 A | 2/2000 | Cole et al. |
| 6,052,035 A | 4/2000 | Nolan et al. |
| 6,064,224 A | 5/2000 | Esch et al. |
| 6,266,001 B1 | 7/2001 | Fang et al. |
| 6,288,564 B1 | 9/2001 | Hedberg |
| 6,291,881 B1 | 9/2001 | Yang |
| 6,297,759 B1 | 10/2001 | Lewyn |
| 6,330,193 B1 | 12/2001 | Yu et al. |
| 6,344,765 B2 | 2/2002 | Taguchi |
| 6,411,122 B1 | 6/2002 | Mughal et al. |
| 6,418,500 B1 | 7/2002 | Gai et al. |
| 6,424,170 B1 | 7/2002 | Raman et al. |
| 6,442,644 B1 | 8/2002 | Gustavson et al. |
| 6,448,813 B2 | 9/2002 | Garlepp et al. |
| 6,462,581 B1 | 10/2002 | Davies et al. |
| 6,462,588 B2 | 10/2002 | Lau et al. |
| 6,467,013 B1 | 10/2002 | Nizar |
| 6,495,997 B2 | 12/2002 | Hall et al. |

(Continued)

OTHER PUBLICATIONS

SLDRAM Inc. Draft/Advance, "400 Mb/s/pin SLDRAM—4M×18 SLDRAM Pipelined, Eight Bank, 2.5V Operation." Revised Jul. 9, 1998. 69 pages.

(Continued)

*Primary Examiner*—Hal D Wachsman
(74) *Attorney, Agent, or Firm*—Silicon Edge Law Group LLP; Arthur J. Behiel

(57) ABSTRACT

Described are amplifiers that facilitate high-speed communication with calibrated drive strength and termination impedance. Drivers and termination elements can be divided into a number N of parallel portions, one or more of which can be updated while signals (e.g, clock or data) are transmitted. Some embodiments identify elements in a high-impedance state by examining incoming signals.

10 Claims, 8 Drawing Sheets

U.S. PATENT DOCUMENTS

| | | | |
|---|---|---|---|
| 6,509,756 | B1 | 1/2003 | Yu et al. |
| 6,509,757 | B1 * | 1/2003 | Humphrey ............... 326/30 |
| 6,511,901 | B1 | 1/2003 | Lam et al. |
| 6,525,558 | B2 | 2/2003 | Kim et al. |
| 6,530,062 | B1 | 3/2003 | Liaw et al. |
| 6,531,784 | B1 | 3/2003 | Shim et al. |
| 6,545,522 | B2 | 4/2003 | Mughal et al. |
| 6,573,746 | B2 * | 6/2003 | Kim et al. ............... 326/30 |
| 6,573,747 | B2 | 6/2003 | Radhakrishnan |
| 6,597,298 | B2 | 7/2003 | Kim et al. |
| 6,606,004 | B2 | 8/2003 | Staszewski et al. |
| 6,608,507 | B2 | 8/2003 | Garrett, Jr. et al. |
| 6,643,787 | B1 | 11/2003 | Zerbe et al. |
| 6,661,250 | B2 | 12/2003 | Kim et al. |
| 6,711,073 | B2 | 3/2004 | Martin |
| 6,734,702 | B1 * | 5/2004 | Ikeoku et al. ............ 326/30 |
| 6,762,620 | B2 | 7/2004 | Jang et al. |
| 6,768,352 | B1 | 7/2004 | Maher et al. |
| 6,781,416 | B1 | 8/2004 | Nguyen et al. |
| 6,806,728 | B2 | 10/2004 | Nguyen et al. |
| 6,940,303 | B2 | 9/2005 | Vargas |
| 6,980,020 | B2 | 12/2005 | Best et al. |
| 7,019,556 | B2 * | 3/2006 | Yoo ............... 326/30 |
| 2001/0047450 | A1 | 11/2001 | Gillingham et al. |
| 2003/0141896 | A1 | 7/2003 | Yu et al. |
| 2004/0044808 | A1 * | 3/2004 | Salmon et al. ............ 710/8 |
| 2004/0124850 | A1 | 7/2004 | Koneru |
| 2004/0222821 | A1 * | 11/2004 | Ho et al. ............... 327/65 |
| 2005/0041683 | A1 | 2/2005 | Kizer |
| 2005/0052200 | A1 | 3/2005 | Nguyen et al. |
| 2005/0057275 | A1 | 3/2005 | Nguyen et al. |
| 2005/0057278 | A1 | 3/2005 | Nguyen et al. |
| 2006/0132171 | A1 * | 6/2006 | Nguyen ............... 326/30 |

OTHER PUBLICATIONS

Ware, Frederick A., Rambus Advance Information "Direct RAC Data Sheet." Document DL0064, Version 1.11. Jul. 2000. 66 pages.

"Hastings Rambus Asic Cell Specification Generic Implementation, Revision 0.1 Preliminary." Modified Jun. 20, 2000. 149 pages.

Al-Sarawi, Said F., "A Review of 3-D Packaging Technology." IEEE Transaction on Components, Packaging, and Manufacturing Technology—Part B, vol. 231, No. 1 Feb. 1998. 14 pgs.

Ko, Hyoung-Soo, "Development of 3-Dimensional Memory Die Stack Packages Using Polymer Insulated Sidewall Technique." 1999 Electronic Components and Technology Conference, pp. 663-667.

Nakase, Yasunobu, "Source-Synchronization and Timing Vernier Techniques for 1.2-GB/s SLDRAM Interface." IEEE Journal of Solid-State Circuits, vol. 34, No. 4, Apr. 1999, pp. 494-501.

Gillingham, Peter, "SLDRAM Architectural and Functional Overview." SLDRAM Consortium, Aug. 29, 1997. 14 pages.

Paris, Lluis, et al., "WP 24.3: An 800MB/s 72Mb SLDRAM with Digitally-Calibrated DLL." 1999 ISSCC Slide Supplement, Session 24, 2 pgs.

"Intel Preliminary, Intel 430TX PCISET: 82439TX System Controller (MTXC)." Feb. 1997. Order No. 290559-001. 83 pages.

Johnson, Chris, "Graphics DDR3 On-Die Termination and Thermal Considerations." Micron Designline, vol. 12, Issue 1. Rev. Apr. 1, 2003. 8 pgs.

Johnson, Chris, "The Future of Memory: Graphics DDR3 SDRAM Functionality." Micron Designline, vol. 11, Issue 4. Copyright 2002. 8 pgs.

Micron, "Graphics DDR3 DRAM." Advance, 256Mb: ×32 GDDR2S DRAM, MT44H8M32—2 MEG ×32×4 Banks. Copyright 2003. 67 pgs.

Kim, Su-Chul et al., "Programmable Digital On-Chip Terminator." SRAM Design, Memory Division, Samsung Electronics, Korea, 449-711. 2002. 4 pgs.

Khouri, Gaby, "Evaluation of Alcatel Patent Portfolio by Semiconductor Insights." Nov. 2004. 54 pages.

Gabara, Thaddeus J., "On-Chip Terminating Resistors for High Speed ECL-CMOS Interfaces." IEEE, Feb. 1992, pp. 292-295.

Gabara, Thaddeus J. et al., "A 200 MHz 100K ECL Output Buffer for CMOS ASICs." IEEE, 1990. pp. 8-5.1 to 8-5.4.

Knight, Thomas F. Jr, "A Self-Terminating Low-Voltage Swing CMOS Output Driver." IEEE Journal of Solid-State Circuits, vol. 23, No. 2, Apr. 1998. pp. 457-464.

Gabara, Thaddeus J., "Digitally Adjustable Resistors in CMOS for High-Performance Applications." IEEE Journal of Solid-State Circuits, vol. 27, No. 8, Aug. 1992, pp. 1176-1185.

U.S. Appl. No. 11/018,163, filed Dec. 2004, Nguyen, Huy.

U.S. Appl. No. 11/176,876, filed Jul. 2005, Huy M. Nguyen.

U.S. Appl. No. 11/100,949, filed Apr. 2005, Huy M. Nguyen.

Babcock, J.A., et al. "Precision Electrical Trimming of Very Low TCR Poly-SiGe Resistors." IEEE Electron Device Letters, vol. 21, No. 6. Jun. 2000. pp. 283-285.

Shay, Sunay et al. "A Temperature Independent Trimmable Current Source." Department of Engineering Science University of Oxford. ISCAS 2002. 4 pages.

* cited by examiner

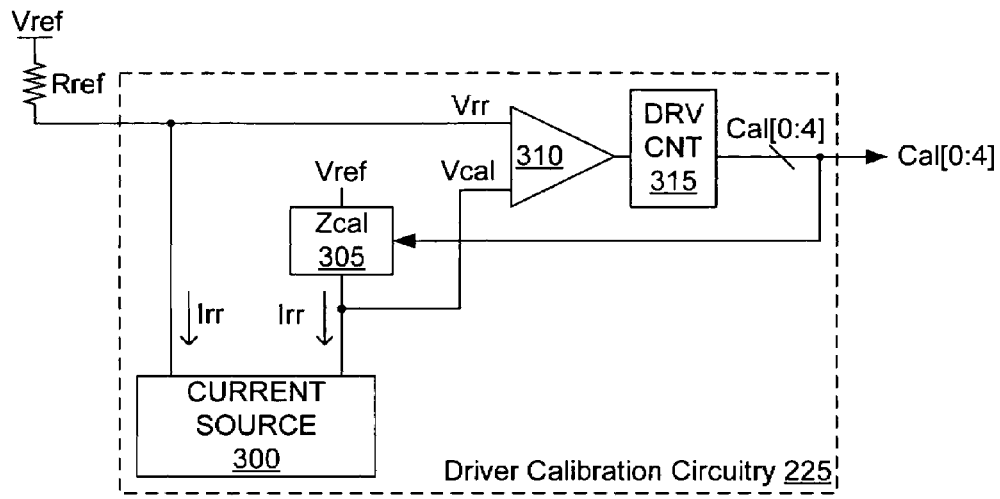
Fig. 3
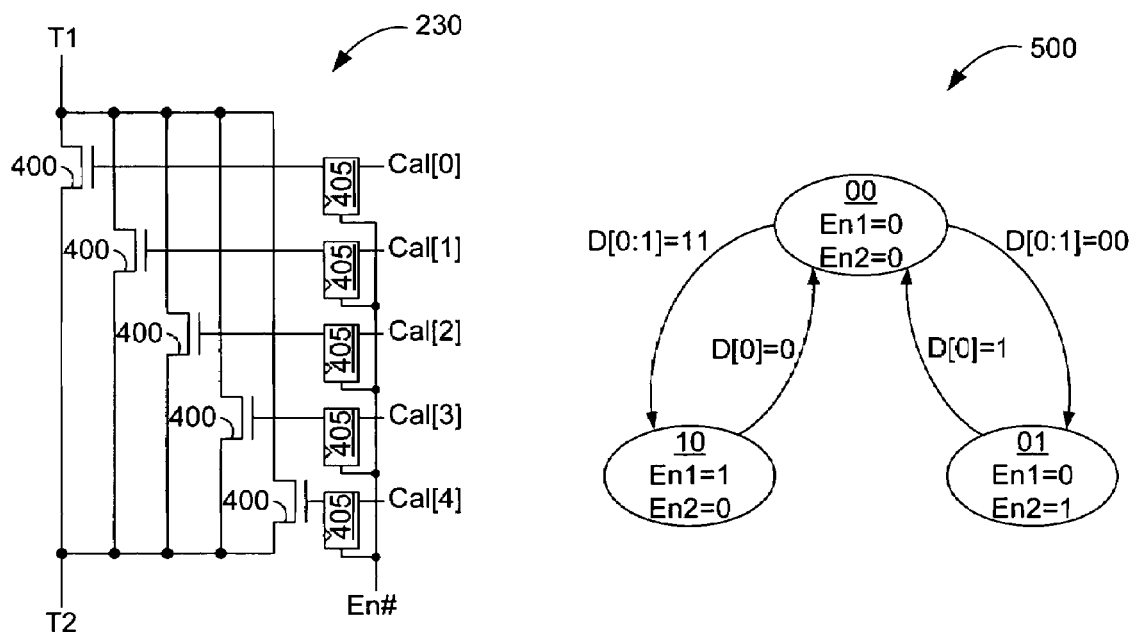
Fig. 4
Fig. 5

DRIVER CALIBRATION METHODS AND CIRCUITS

BACKGROUND

High-speed data communication systems are known to include current-mode driver amplifiers (drivers) and receivers. For best speed performance, the drive current should be calibrated. Such calibration should account for process variations, and is preferably repeated as needed to compensate for changes due to supply-voltage and temperature fluctuations.

Supply-voltage and temperature fluctuations occur during device operation, so driver recalibration is often desired of active (transmitting) drivers. Unfortunately, driver recalibration can introduce noise, and so is typically carried out on inactive drivers. Recalibration schemes either interrupt transmission or await a time when the driver is inactive. A better solution would allow for recalibration of active drivers without interrupting data transmission or introducing noise.

BRIEF DESCRIPTION OF THE FIGURES

FIG. 3 depicts impedance calibration circuitry 225 in accordance with one embodiment.

FIG. 4 depicts one of impedances 230 of FIG. 2 in accordance with one embodiment.

FIG. 5 depicts a state machine 500 illustrating the function of update logic 220 in accordance with one embodiment.

DETAILED DESCRIPTION

Figure 1:
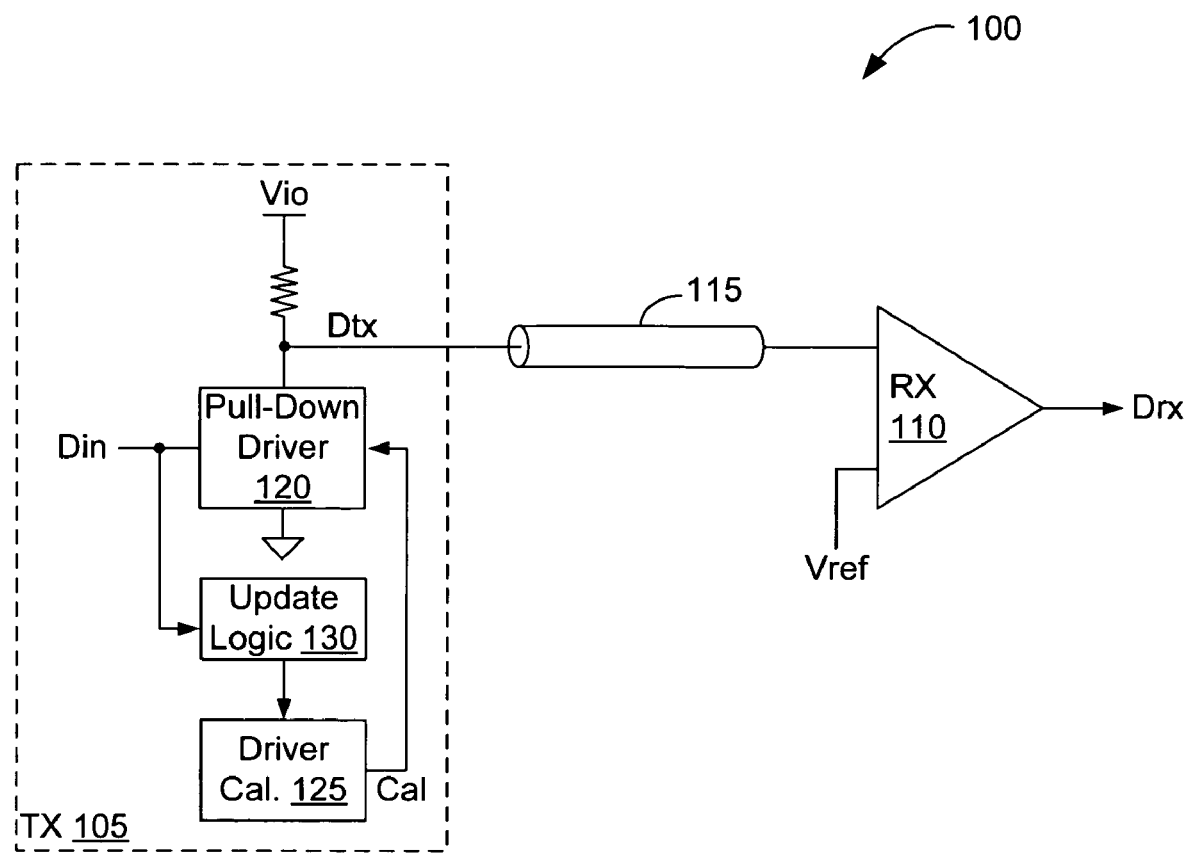
FIG. 1 is a block diagram of a data communication system 100 in accordance with one embodiment.

FIG. 1 is a block diagram of a data communication system 100 in accordance with one embodiment. Communication system 100 includes a transmitting amplifier 105 connected to a receiver 110 via a communication channel 115. Amplifier 105 includes a pull-down driver 120, the drive strength of which is calibrated by some driver calibration circuitry 125. Changing drive strength while driver 120 is in a low-impedance state can introduce undesirable glitches in the transmitted signal. To prevent such glitches, update logic 130 monitors incoming data Din on the corresponding input node to identify times during which driver 120 is in a high-impedance state and only then enables driver calibration circuitry 125 to recalibrate the drive strength of driver 120. Amplifier 105 can thus periodically adjust the drive strength of driver 120 to compensate for temperature and supply-voltage fluctuations without interrupting the transmission of data. As with other designations herein, each of Din, Dtx and Drx refer both to a signal and a corresponding node; whether a given designation refers to a signal or a node will be clear from the context.

Figure 2:
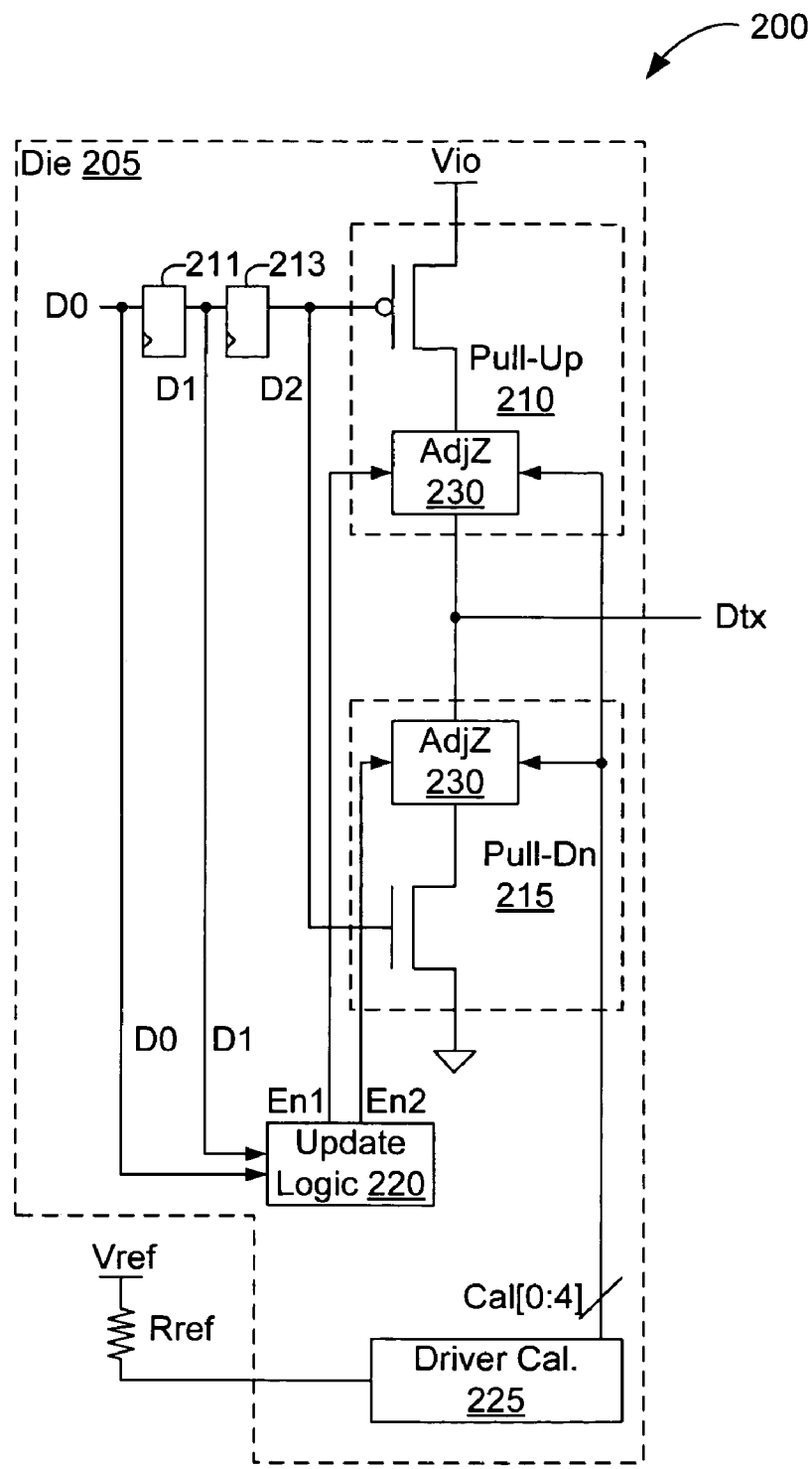
FIG. 2 depicts an amplifier 200 in accordance with another embodiment.

FIG. 2 depicts an amplifier 200 in accordance with another embodiment. The drive circuitry of amplifier 200 is instantiated on an integrated-circuit (IC) die 205 coupled to a reference voltage Vref via an external reference resistor Rref. The amplifier conveys data from an input node D0 to the control terminals of a pull-up driver 210 and a pull-down driver 215, which are coupled to the input node via a pair of sequential storage elements 211 and 213. Drivers 210 and 215 extend between an amplifier output node Dtx and respective supply terminals Vio and ground. While there may be some cross-over, in general one of drivers 210 and 215 is active and the other inactive when transmitting data on output node Dtx. Amplifier 200 includes update logic 220 that monitors incoming data to schedule adjustments for the inactive driver. These adjustments are based upon calibration signals developed by some impedance calibration circuitry 225 coupled to the calibration ports of drivers 210 and 215.

Drivers 210 and 215 can be implemented in a number of configurations. In this example, each driver includes an adjustable impedance 230 coupled in series with a transistor between output node Dtx and the respective supply terminal. Each impedance 230 includes an enable port coupled to enable logic 220 and a calibration port Cal[0:4] coupled to impedance calibration circuitry 225. Update logic monitors two consecutive bits D0 and D1 of the incoming signal to identifying timing windows during which one of drivers 210 and 215 will be inactive, and then enables the respective impedance 230 of the inactive driver to receive the calibration signal Cal[0:4]. Update logic 220 uses two incoming bits to identify inactive drivers, but can use more or fewer bits in other embodiments. Update logic 220, impedance calibration circuitry, or both can also be enabled periodically in still other embodiments.

FIG. 3 depicts impedance calibration circuitry 225 in accordance with one embodiment. Calibration circuitry 225 includes a current source 300 that draws identical currents Irr through reference resistor Rref and a calibration impedance 305. The impedance through impedance 305 changes in response to calibration signal Cal[0:4] in a manner proportional to impedances 230 of FIG. 2, the proportion being one-to-one in some embodiments. A comparator 310 compares the voltage Vrr from reference resistor Rref with the voltage Vcal from impedance 305, causing a counter 315 to increment (decrement) when voltage Vrr is greater than (less than) calibration voltage Vcal. In this way, impedance calibration circuitry 225 maintains the proportion between impedance 305 and reference resistor Rref. Impedance 305 is similar to impedances 230, and so responds similarly to process, voltage, and temperature variations. The calibration signal required to maintain the desired proportionality between impedance 305 and reference resistor Rref can therefore be distributed to impedances 230 to similarly maintain their values.

FIG. 4 depicts one of impedances 230 of FIG. 2 in accordance with one embodiment. Impedance 230 includes a plurality of transistors 400 coupled between a pair of current-handling terminals T1 and T2. Transistors 400 are, in this example, coupled in parallel. The gate widths of transistors 400 are binary weighted to provide a range of $2^5$ impedance values. The contents of five storage elements 405 determine which of transistors 400 is biased on. Each storage element 405 includes a enable terminal that allows update logic 220 of FIG. 2 to selectively direct calibration updates to inactive drivers. In one embodiment, calibration impedance 305 of FIG. 3 is identical to impedance 230, absent storage elements 405 and the associated enable terminal En#.

FIG. 5 depicts a state machine 500 illustrating the function of update logic 220 in accordance with one embodiment. Beginning in state 00, both enable signals En1 and En2 are at voltages expressing a logic zero. In that case, the storage elements within both impedances 230 are unable to capture updated calibration signals. Update logic 220 remains instate 00 until the incoming data symbols D0 and D1 are both ones or both zeros, in which case a sufficiently long update window exists for the one of impedances 230 not used to expresses the consecutive symbols. Assume, for example, that data bits D0 and D1 are both logic ones: in that case, update logic 220 transitions to state 10 on the next transmit clock edge and asserts enable signal En1. Impedance 230 within pull-up driver 210 then captures the current calibration signal Cal[0:4] on the next transmit clock edge, and is thus recalibrated. Update logic 220 remains in state 10 until data D0 is a zero, and then transitions back to state 00. Update logic 220 similarly updates pull-down driver 215, moving to state 01 when data symbols D0 and D1 are both zeros and back to state 00 when symbol D0 returns to a logic one.

Figure 6:
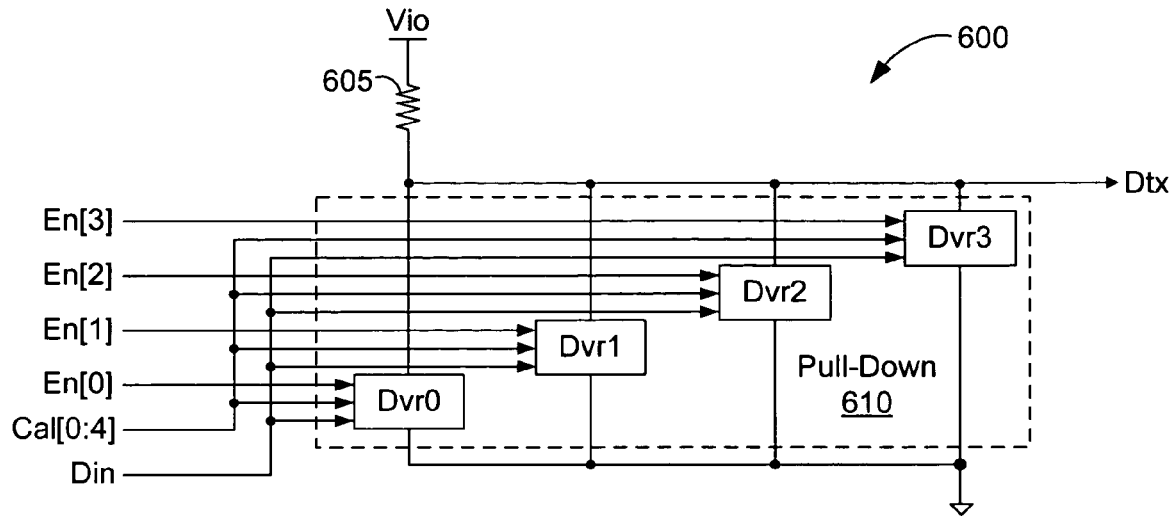
FIG. 6 depicts an amplifier 600 with a conventional pull-up resistor 605 and a pull-down driver 610 adapted in accordance with one embodiment.

FIG. 6 depicts an amplifier 600 with a conventional pull-up resistor 605 and a pull-down driver 610 adapted in accordance with one embodiment. Unlike the embodiments noted above, driver 610 is divided into a plurality (e.g. four) of drivers Dvr[0:3] coupled in parallel between output node Dtx and one supply terminal (ground). Incoming data Din and calibration signal Cal[0:4] are fed to each of drivers Dvr[0:3]. A collection of enable signals En[0:3], each coupled to an enable port of a respective one of drivers Dvr[0:3], allows external control circuitry to selectively enable the calibration feature of each driver.

Driver 610 can be adapted to support a number of calibration schemes that may or may not take into consideration the pattern of the incoming data. In one embodiment, for example, only three of the four drivers Dvr[0:3] are enabled at any one time, leaving the fourth to receive updated calibration signals Cal[0:4] without producing a glitch in the outgoing data. The newly calibrated driver can then substitute for one of the active drivers, at which time newly inactive driver is available for calibration. In this way, all the active drivers can be successively updated. In another embodiment all of the drivers may be active simultaneously, but the calibration port of only one or a subset is enabled at a time. In either case, driver 610 may be updated by successively updating less than all of drivers Dvr[0:3].

Figure 7:
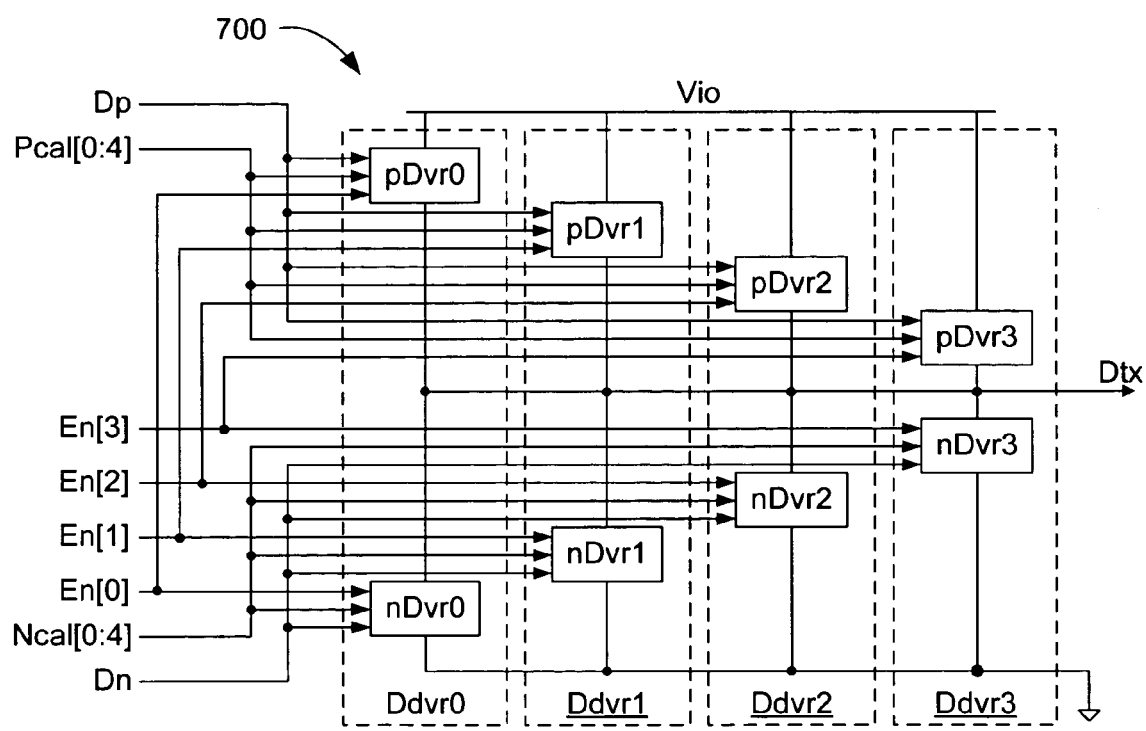
FIG. 7 depicts a push-pull amplifier 700 in accordance with another embodiment.

FIG. 7 depicts a push-pull amplifier 700 in accordance with another embodiment. Amplifier 700 is similar to amplifier 600 of FIG. 6, but uses calibrated pull-up drivers in place of resistor 605. Amplifier 700 is divided into a plurality of (e.g. four) drivers Ddvr[0:3] coupled in parallel between supply terminals Vio and ground. Data Dp/Dn and calibration signals Pcal[0:4] and Ncal[0:4] are fed to each of drivers Ddvr[0:3]. A collection of enable signals En[0:3], each coupled to an enable port of a respective one of drivers Ddvr[0:3], allows external control circuitry to selectively enable the calibration feature of each driver. Exemplary control circuitry is detailed below in connection with FIG. 8.

Each of drivers Ddvr[0:3] includes a pull-up driver and a pull-down driver. Driver Ddvr0, for example, includes a pull-up driver pDvr0 and a pull-down driver nDvr0. The pull-up drivers are activated by data signal Dp and are calibrated using calibration signals Pcal[0:4], whereas the pull-down drivers are activated by data signal Dn and are calibrated using calibration signals Ncal[0:4]. As with amplifier 600 of FIG. 6, amplifier 700 can be adapted to support a number of calibration schemes that may or may not take into consideration the pattern of the incoming data.

Figure 8:
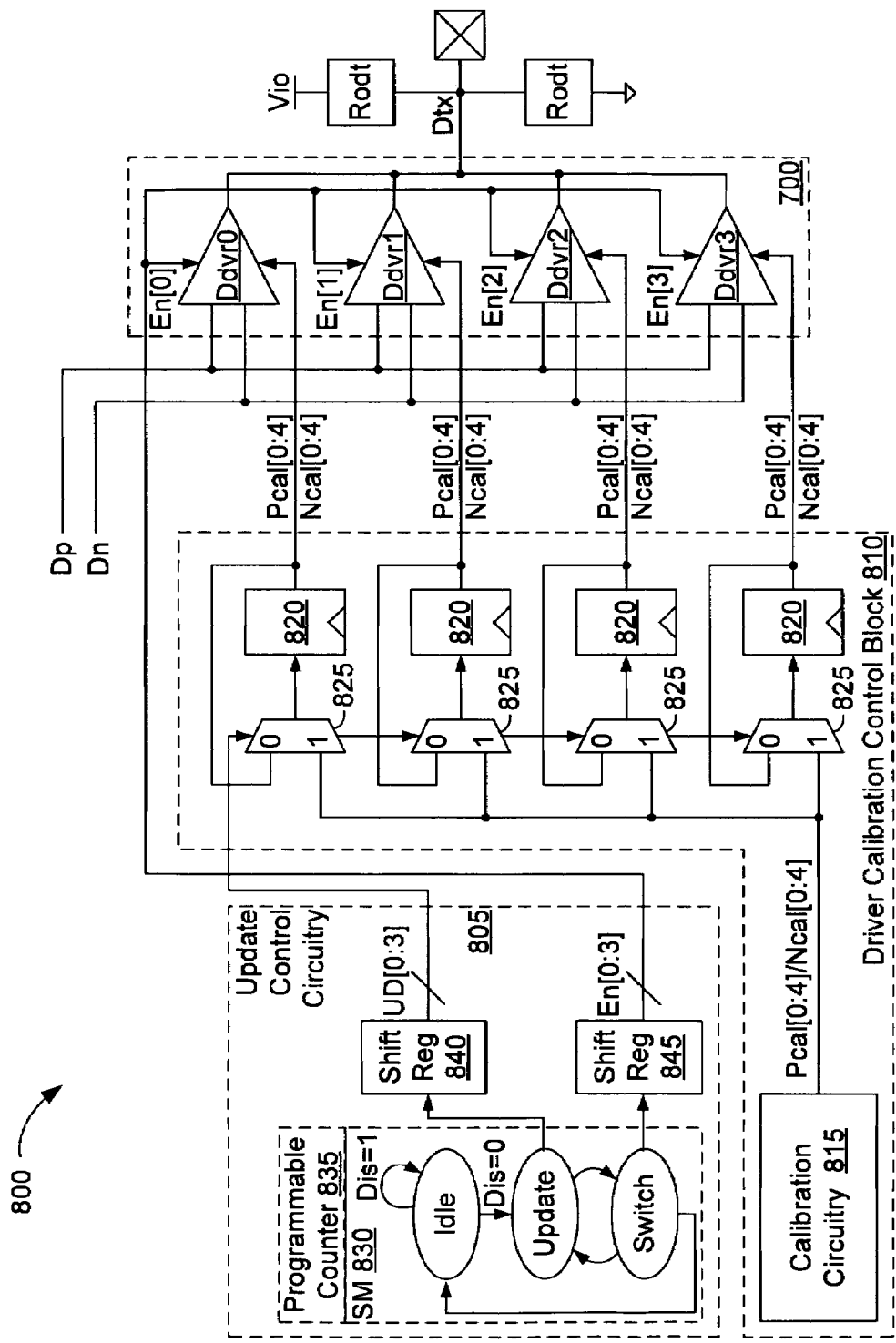
FIG. 8 depicts an amplifier 800 in accordance with an embodiment that includes push-pull amplifier 700 of FIG. 7 and, to update the drivers within amplifier 700, some update control circuitry 805 and a driver calibration block 810.

FIG. 8 depicts an amplifier 800 in accordance with an embodiment that includes push-pull amplifier 700 of FIG. 7 and, to update the drivers within amplifier 700, some update control circuitry 805 and a calibration control block 810. Calibration control block 810 includes calibration circuitry 815 that maintains impedance calibration signals Pcal[0:3] and Ncal[0:4] as needed to adjust the strengths of drivers Ddvr[0:3] to account for process, temperature, and supply voltage fluctuations. Calibration control block 810 additionally includes, for each driver, a register 820 and a multiplexer 825 that together apply driver-specific calibration signals to the drivers and facilitate driver-specific update control.

Update control circuitry 805 includes a state machine 830, an associated programmable counter 835, and a pair of shift registers 840 and 845. Update control circuitry 805 delivers update signals UD[0:3] to calibration control block 810 to select which driver is to be updated, and delivers enable signals En[0:3], one to each driver, to selectively enable the drivers. Amplifier 800 may include one or more fixed or adjustable on-die termination elements Rodt. The operation of amplifier 800 is described below in connection with the following Table 1.

TABLE 1

| Clock Tick Number | State | Update En UD[0:3] | Driver En EN[0:3] |
|---|---|---|---|
| 0 | Idle | 0000 | 1110 |
| n | Update | 0001 | 1110 |
| 2n | Switch | 0001 | 0111 |
| 3n | Update | 1000 | 0111 |
| 4n | Switch | 1000 | 1011 |
| 5n | Update | 0100 | 1011 |
| ‖ | ‖ | ‖ | ‖ |

State machine 830 can be disabled by asserting a disable signal (Dis=1), in which case state machine 830 remains in an idle state. Shift register 840 stores all zeroes in the Idle state, so the outputs of registers 820 are fed back to their respective inputs via multiplexers 825, preventing calibration updates to any of drivers Ddvr[0:3]. Shift register 845 stores ones and a single zero (e.g. 1110) in the Idle state so that all but one of the drivers are enabled. In the example of Table 1, the least-significant bits of UD[0:3] and EN[0:3] correspond to driver Ddvr0, so driver Ddvr0 is disabled.

State machine 830 enters the Update state when the disable signal is deasserted (Dis=0). The disable signal might be deasserted periodically, after a number of clock cycles n dictated by programmable counter 835, for example. A single logic one is loaded into the location of shift register 840 corresponding to the disabled driver Ddvr0, gating the output of calibration circuitry 815 to the one of registers 820 associated with driver Ddvr0. That register will therefore capture any changes to calibration signals Pcal[0:4] and Ncal[0:4] on the next clock cycle, and will apply the updated signals to driver Ddvr0.

After again waiting n clock cycles, state machine 830 transitions to state Switch. Shift register 845 shifts the stored zero one bit, thus enabling the recently updated driver Ddvr0 and disabling another (in this case, driver Ddvr 3). State machine 830 will continue to vacillate between the update and switch states until the disable signal is asserted (Dis=1).

In the embodiment of FIG. 8, one driver of amplifier 800 is always inactive, and so can be calibrated without adversely impacting data being transmitted. Other embodiments operate in a manner similar to amplifier 105 of FIG. 1 and amplifier 200 of FIG. 2, in which case the incoming data Dp/Dn is monitored to find update windows during which pull-up or pull-down drivers within drivers Ddvr[0:3] are inactive.

Only four drivers are coupled in parallel in FIG. 8, though more or fewer may be used. In addition, the number of disabled drivers can be changed to provide coarse adjustment to the overall driver strength. The number of enabled drivers might be determined at start-up, for example, with shift registers 840 and 845 loaded with the appropriate numbers of ones and zeroes. The calibration process detailed above can then be applied as needed to compensate for changes in temperature and supply voltage.

Figure 9:
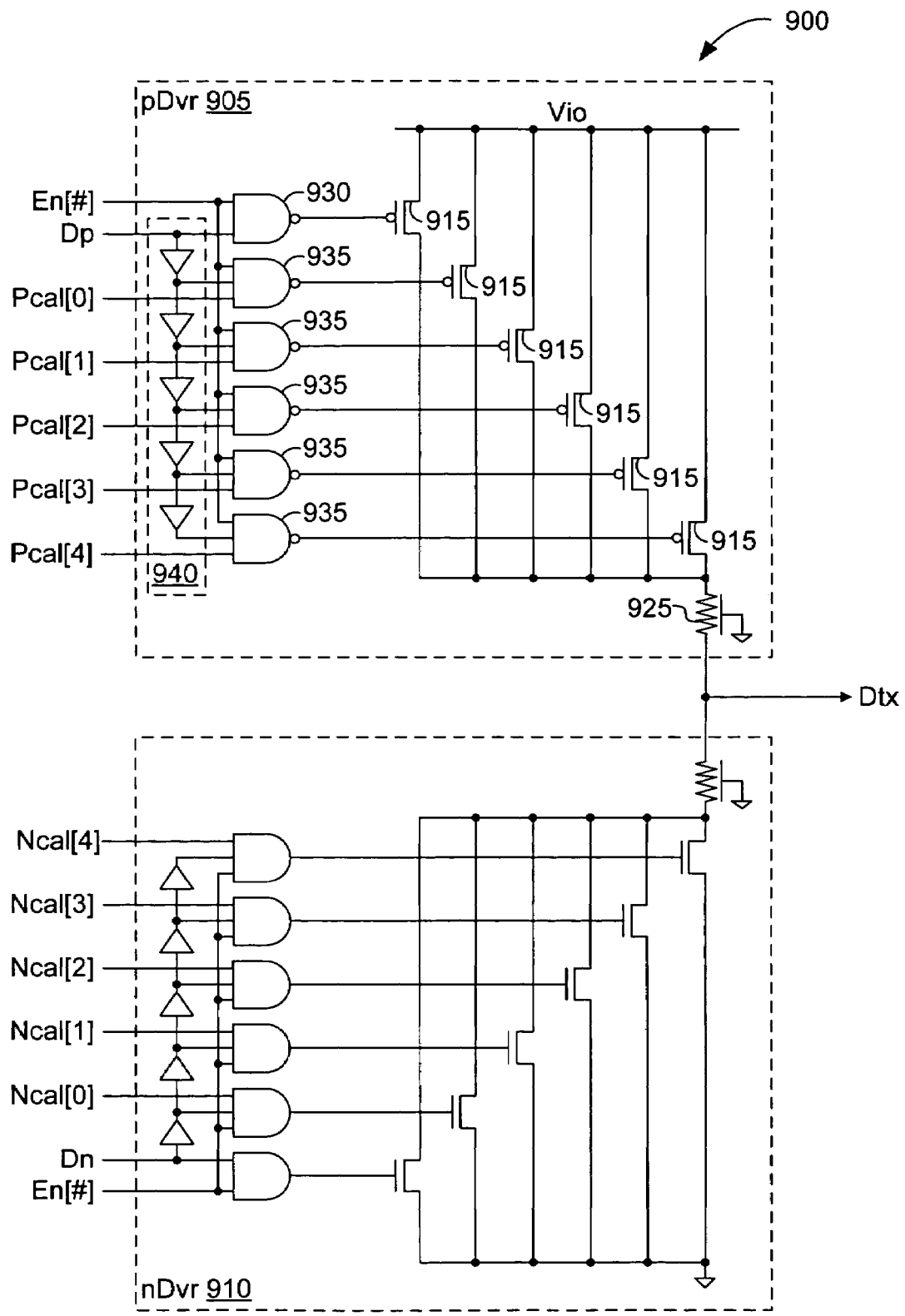
FIG. 9 depicts a driver 900 that can be used in place of each driver of FIG. 8.

FIG. 9 depicts a driver 900 that can be used in place of each driver of FIG. 8. Driver 900 includes a pull-up driver 905 and a pull-down driver 910 coupled in series between first and second supply terminals Vio and ground. The driver output Dtx is taken from the common node between drivers 905 and 910.

Driver 905 includes six PMOS transistors 915 coupled in parallel between nodes Vio and Dtx, but there can be more or fewer, depending upon the desired range and granularity of adjustment. Each PMOS transistor controls the current through a respective resistive path. These resistive paths can be binary-weighted, an area-efficient configuration that produces a large number of potential impedance values. The I-V characteristics of transistors may be somewhat non-linear, and this non-linearity may introduce some non-linearity in the impedance through driver 905. A resistor 925, e.g. of polysilicon, improves the linearity of the impedance through driver 905 over the range of interest. In an embodiment that complies with a stub series-terminated logic (SSTL) interface standard in which Vio may be 1.8 Volts, 2.5 Volts, or 3.3 Volts, the impedances through drivers 905 and 910 can be adjusted over a range of 14-22 Ohms in steps of 0.5 Ohms.

The enable signal En# (e.g., En[0]) controls the topmost transistor 915 via a two-input NAND gate 930 and the remaining transistors 915 via three-input NAND gates 935: when enable En[#] is a zero, each of NAND gates 930 and 935 issues a logic one to the gates of transistors 915, turning them off. If the enable signal is a one, NAND gate 930 turns on the topmost transistor 915 when data signal Dp is a logic one. Those of NAND gates 935 receiving a logic one from the corresponding bit of calibration signal Pcal[0:4] will also enable their corresponding transistors 915 when data signal Dp is a logic one. In the depicted embodiment, a series of buffers 940 delays input signal Dp so enabled transistors 915 are turned on successively to control the slew rate of driver 900. Buffers 940 may exhibit fixed or adjustable delays.

In some embodiments, the core logic used to implement control logic, such as NAND gates 930 and 935, is powered using a supply-voltage level lower than the input/output voltage Vio. Level shifters may therefore be included as need to communicate logic signals between e.g. NAND gates 930 and 935 and transistors 915. The placement and configuration of level shifters is well known to those of skill in the art, and is therefore omitted here for clarity of expression.

Pull-down driver 910 is similar to pull-up driver 905, but uses NMOS transistors in lieu of PMOS and AND gates in lieu of NAND gates. A detailed discussion of driver 910 is omitted for brevity.

Figure 10:
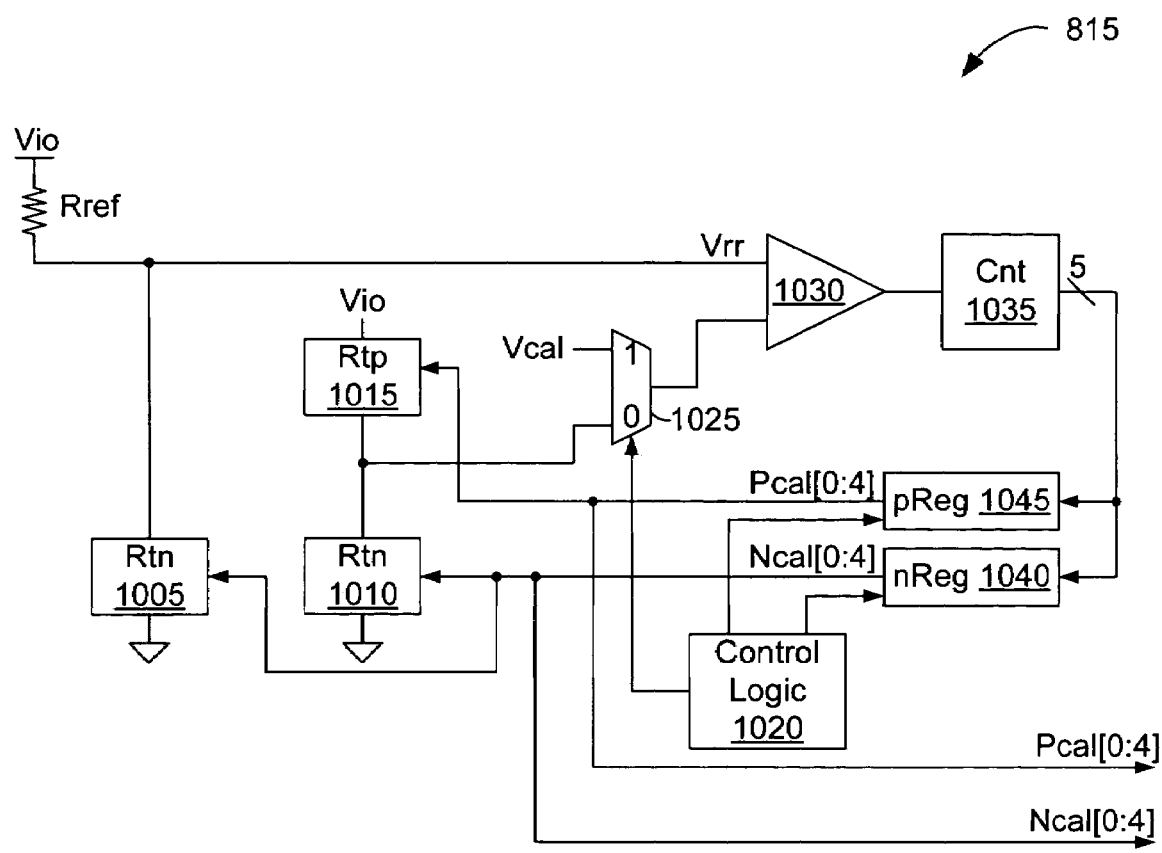
FIG. 10 depicts calibration circuitry 815 of FIG. 8 in accordance with one embodiment.

FIG. 10 depicts calibration circuitry 815 of FIG. 8 in accordance with one embodiment. Calibration circuitry 815 includes two n-type reference impedances 1005 and 1010 and one p-type reference impedance 1015. N-type reference impedances 1005 and 1010 are designed to be identical, or nearly so, to the transistors of pull-down driver 910 depicted in FIG. 9, with the lowermost transistor biased on and the five remaining transistors controlled by calibration signal Ncal[0:4]. The transistors of driver 910 and reference impedances 1005 and 1010 are made using the same process and are subject to similar fluctuations in supply voltage and temperature, and can therefore be expected to exhibit similar impedances in response to the same calibration signal. P-type reference impedance 1015 is designed to be identical, or nearly so, to the transistors of pull-up driver 905 of FIG. 9, with the uppermost transistor biased on and the five remaining transistors controlled by calibration signal Pcal[0:4]. The transistors of driver 905 and reference impedance 1015 are made using the same process and are subject to similar fluctuations in supply voltage and temperature, and can therefore be expected to exhibit similar impedances in response to the same calibration signal.

Calibration circuitry 815 includes some control logic 1020, such as a state machine, that calibrates impedances 1005, 1010, and 1015 by comparison with an external precision reference resistor Rref. To begin with, control logic 1020 causes a multiplexer 1025 to convey a calibration voltage Vcal (e.g., half of Vio) to one terminal of a comparator 1030. The other input terminal of comparator 1030 is coupled between external reference resistor Rref and internal reference impedance 1005. A counter 1035 counts up when voltage Vrr from reference resistor Rref exceeds the calibration voltage Vcal. The contents of counter 1035 is captured in a register 1040 during the pull-down calibration, so that Ncal[0:4] increases with counter 1035. The increased count reduces the value of impedance 1005, and consequently reduces voltage Vrr. Voltage Vrr thus converges on voltage Vcal. In the case in which voltage Vcal is half of voltage Vio, this convergence occurs when the value of impedance 1005 equals that of reference resistor Rref. Impedances 1005 and 1010 are identical, so this procedure calibrates them both.

Once impedances 1005 and 1010 have had sufficient time for calibration, control logic 1020 prevents further updates to register 1040, and thus holds the values of impedances 1005 and 1010. Control logic 1020 then causes multiplexer 1025 to select the node between impedances 1015 and 1010 for comparison to voltage Vrr and enables a second register 1045 to receive the counts from counter 1035. Counter 1035 counts up when the voltage Vrr exceeds the voltage between impedances 1010 and 1015. The contents of counter 1035 is captured in register 1045 during the pull-up calibration, so that Pcal[0:4] increases with counter 1035. The increased count reduces the impedance through impedance 1015, and consequently increases the voltage from multiplexer 1025. The two voltages converge when the value of impedance 1015 equals that of reference resistor Rref. Control logic 1020 then freezes the count within register 1045 until initiating the next calibration sequence.

Figure 11:
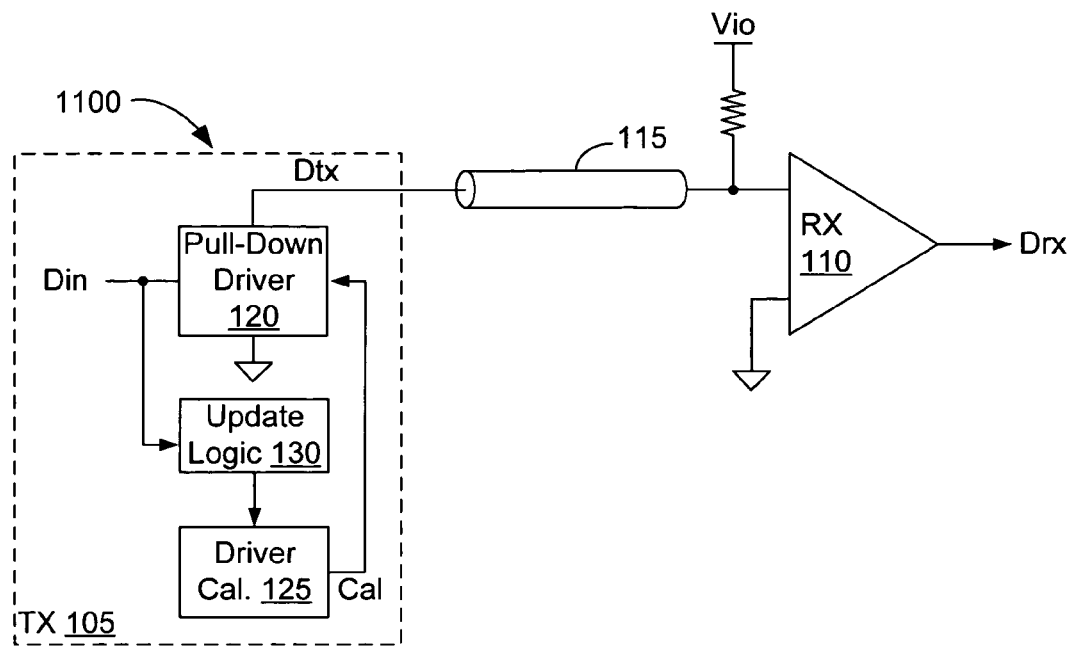
FIG. 11 depicts a communication system 1100 in accordance with another embodiment.

FIG. 11 depicts a communication system 1100 in accordance with another embodiment. System 1100 is in many ways similar to system 100 of FIG. 1, like-identified elements being the same or similar. The operation of system 1100 is sufficiently similar to system 100 that a detailed discussion is unnecessary, and is therefore omitted for brevity.

Figure 12:
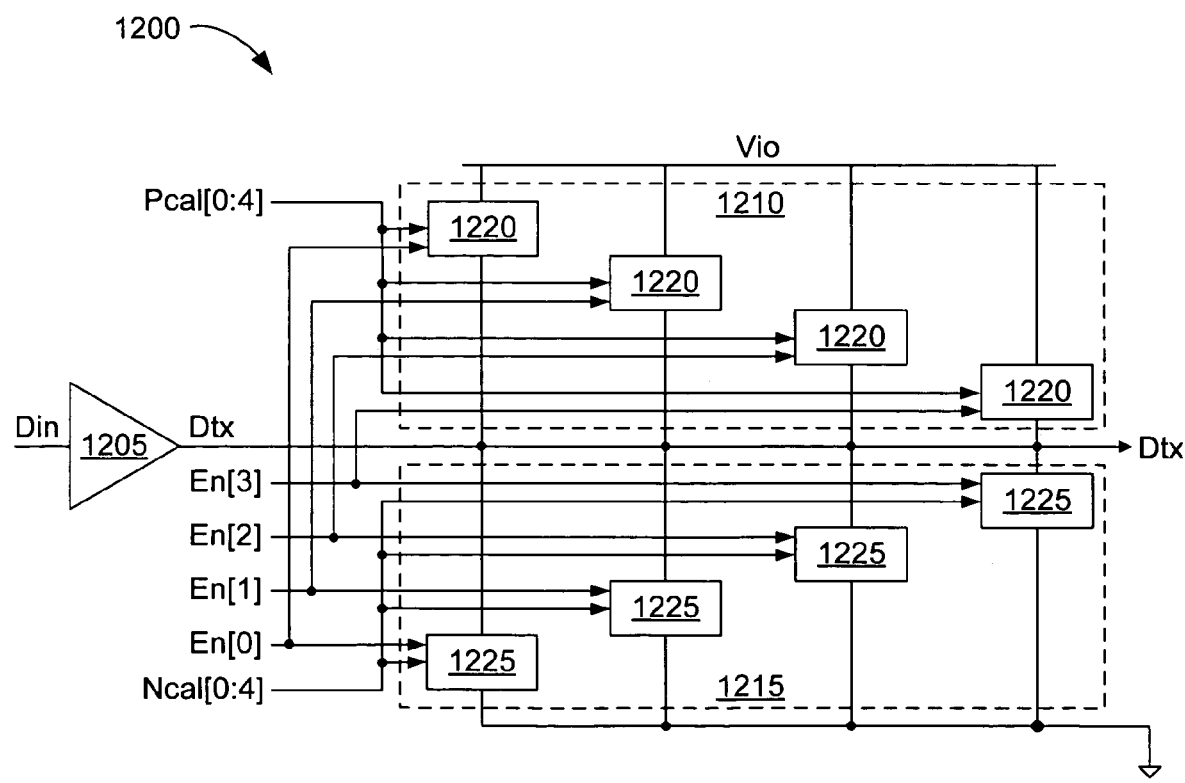
FIG. 12 depicts driver circuitry 1200 in accordance with another embodiment.

FIG. 12 depicts driver circuitry 1200 in accordance with another embodiment. Circuitry 1200 includes an amplifier 1205 and a pair of termination elements 1210 and 1215. Amplifier 1205 can be adaptive, e.g. in the manner of amplifier 700 of FIG. 7. Termination element 1210 includes a number (e.g. four) of sub-elements 1220, each of which may be similar to driver 905 of FIG. 9 but omits data Dp as an input. Likewise, element 1215 includes a number (e.g. four) of sub-elements 1225, each of which may be similar to driver 910 of FIG. 9 but omits data Dn as an input. Sub-elements 1220 and 1225 can be adaptively calibrated in the same manners as the drivers detailed above to facilitate ODT calibration that does not interfere or that interferes minimally with data transfer. Circuitry similar to calibration circuitry 815 of FIGS. 8 and 10 can be used to calibrate termination elements 1210 and 1215, though the impedance and reference voltages may be changed as appropriate to establish a desired termination impedance. Calibration circuitry 815 can be modified to support the requisite termination-calibration impedances and voltages such that the calibration sequences for the drivers and termination elements share some of the calibration circuitry (e.g., comparator 1030, counter 1035, and control logic 1020).

Each of the foregoing embodiments support drive calibration schemes that do not interrupt data transfer. Such schemes are useful where uninterrupted transmission is important, and are not limited to data. Clock drivers, used for on-die buffering schemes for example, transmit relatively continuous clock signals and might thus benefit from clock buffers that can be recalibrated without interrupting clock signals. Embodiments that update active clock drivers may differ from those that update active data drivers, however, because the signal pattern conveyed via a clock driver—alternating high and low levels—is known in advance. Inactive pull-up or pull-down drivers of a clock buffer can thus be identified without monitoring the incoming pattern. If, for example, the voltage level transmitted by a clock buffer is low, update logic can assume the pull-up portion of the clock driver is inactive and that the pull-down portion will be inactive in the next clock cycle. The same assumption can be made if the clock buffer transmitted a low voltage level an even number of clock cycles before or after the present clock cycle.

The amplifiers and receivers discussed herein may be instantiated on separate integrated-circuit (IC) dies, each of which may be any of myriad types of processing chips capable of communicating electrical signals. Typical examples include IC dies that communicate via parallel or serial bus interfaces. Communicating devices can use either unidirectional or bidirectional signal lines, as is well known to those of skill in the art. Further, while the depicted embodiment is described in connection with a typical case in which two dies communicate signals via external lines, other embodiments calibrate drivers to improve communication speed between circuits that exist on the same die or between devices that communicate via a wireless channel.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments will be obvious to those of ordinary skill in the art. For example, (1) the external voltage and resistance references may be substituted in other embodiments with on-chip references; (2) embodiments of the invention can be adapted for use with multi-PAM signals; (3) and clock drivers (either for internal use or transmitting via e.g. an output pad) used for e.g. on-die buffering schemes. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description.

What is claimed is:

1. An amplifier comprising:
   a. an amplifier input node;
   b. an amplifier output node;
   c. a supply terminal;
   d. an impedance coupled between the supply terminal and the amplifier output node, the impedance including a calibration port, an enable port, and a control terminal coupled to the amplifier input node;
   e. impedance calibration circuitry coupled to the calibration port; and
   f. update logic coupled between the enable port and at least one of the amplifier input node and the amplifier output node.

2. The amplifier of claim 1, wherein the impedance is coupled in series with a transistor.

3. The amplifier of claim 1, wherein the impedance includes a plurality of transistors of various gate widths.

4. The amplifier of claim 3, wherein the gate widths are binary coded.

5. The amplifier of claim 1, wherein the impedance is a pull-down driver.

6. The amplifier of claim 5, further comprising a second supply terminal and a pull-up impedance coupled between the second supply terminal and the amplifier output node, the pull-up impedance including a second calibration port, a second enable port, and a second control terminal.

7. The amplifier of claim 6, wherein the second control terminal is coupled to the amplifier input node.

8. The amplifier of claim 1, further comprising a sequential storage element coupled between the amplifier input node and the update logic.

9. The amplifier of claim 1, wherein the impedance calibration circuitry includes a variable impedance having a second calibration port, the variable impedance exhibiting a first range of impedances proportional to a second range of impedances exhibited by the first-mentioned impedance.

10. The amplifier of claim 1, wherein the impedance is one of a plurality of impedances coupled between the supply terminal and the amplifier output node.

* * * * *